(12) United States Patent
Doyle et al.

(10) Patent No.: US 7,501,336 B2
(45) Date of Patent: Mar. 10, 2009

(54) METAL GATE DEVICE WITH REDUCED OXIDATION OF A HIGH-K GATE DIELECTRIC

(75) Inventors: Brian S. Doyle, Portland, OR (US);
Jack Kavalieros, Portland, OR (US);
Justin K. Brask, Portland, OR (US);
Matthew V. Mertz, Portland, OR (US);
Mark L. Doczy, Beaverton, OR (US);
Suman Datta, Beaverton, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 312 days.

(21) Appl. No.: 11/158,621

(22) Filed: Jun. 21, 2005

(65) Prior Publication Data

US 2006/0284271 A1 Dec. 21, 2006

(51) Int. Cl.
*H01L 21/3205* (2006.01)
*H01L 21/4763* (2006.01)

(52) U.S. Cl. .................. 438/591; 257/E21.111

(58) Field of Classification Search .................. 438/591
See application file for complete search history.

(56) References Cited

U.S. PATENT DOCUMENTS

| | | | | |
|---|---|---|---|---|
| 6,063,698 | A | 5/2000 | Tseng et al. | 438/585 |
| 6,184,072 | B1 | 2/2001 | Kaushik et al. | 438/197 |
| 6,255,698 | B1 | 7/2001 | Gardner et al. | 257/369 |
| 6,365,450 | B1 | 4/2002 | Kim | 438/216 |
| 6,410,376 | B1 | 6/2002 | Ng et al. | 438/199 |
| 6,420,279 | B1 | 7/2002 | Ono et al. | 438/785 |
| 6,475,874 | B2 | 11/2002 | Xiang et al. | 438/396 |
| 6,514,828 | B2 | 2/2003 | Ahn et al. | 438/240 |
| 6,544,906 | B2 | 4/2003 | Rotondaro et al. | 438/785 |
| 6,586,288 | B2 | 7/2003 | Kim et al. | 438/183 |
| 6,617,209 | B1 | 9/2003 | Chau et al. | 438/240 |
| 6,617,210 | B1 | 9/2003 | Chau et al. | 438/240 |
| 6,620,713 | B2 | 9/2003 | Arghavani et al. | 438/585 |
| 6,642,131 | B2 | 11/2003 | Harada | 438/591 |
| 6,667,246 | B2 | 12/2003 | Mitsuhashi et al. | 438/756 |
| 6,689,675 | B1 | 2/2004 | Parker et al. | 438/585 |

(Continued)

FOREIGN PATENT DOCUMENTS

EP 0 899 784 A2 3/1999

(Continued)

OTHER PUBLICATIONS

Matthew V. Metz, et al., "A Semiconductor Device With a High-K Gate Dielectric and a Metal Gate Electrode", U.S. Appl. No. 11/089,247, filed Mar. 23, 2005.

(Continued)

*Primary Examiner*—Walter L Lindsay, Jr.
(74) *Attorney, Agent, or Firm*—Blakely, Sokoloff, Taylor & Zafman LLP

(57) ABSTRACT

Embodiments of the invention provide a device with a metal gate, a high-k gate dielectric layer and reduced oxidation of a substrate beneath the high-k gate dielectric layer. An oxygen barrier, or capping, layer on the high-k gate dielectric layer and metal gate may prevent such oxidation during processes such as spacer formation and annealing of ion implanted regions.

13 Claims, 6 Drawing Sheets

U.S. PATENT DOCUMENTS

| | | | |
|---|---|---|---|
| 6,696,327 B1 | 2/2004 | Brask et al. | 438/197 |
| 6,696,345 B2 | 2/2004 | Chau et al. | 438/387 |
| 6,709,911 B1 | 3/2004 | Doczy et al. | 438/197 |
| 6,713,358 B1 | 3/2004 | Chau et al. | 438/287 |
| 6,716,707 B1 | 4/2004 | Brask et al. | 438/287 |
| 6,727,130 B2 | 4/2004 | Kim et al. | 438/199 |
| 6,727,543 B2 * | 4/2004 | Lin | 257/314 |
| 6,746,967 B2 | 6/2004 | Brask et al. | 438/752 |
| 6,770,568 B2 | 8/2004 | Brask et al. | 438/746 |
| 6,787,440 B2 | 9/2004 | Parker et al. | 438/591 |
| 6,794,234 B2 | 9/2004 | Polishchuk et al. | 438/199 |
| 6,806,146 B1 | 10/2004 | Brask et al. | 438/287 |
| 6,855,639 B1 | 2/2005 | Brask et al. | 438/742 |
| 6,858,483 B2 | 2/2005 | Doczy et al. | 438/199 |
| 6,867,102 B2 | 3/2005 | Brask et al. | 438/287 |
| 7,221,018 B2 * | 5/2007 | Forbes | 257/324 |
| 2002/0058374 A1 | 5/2002 | Kim et al. | 438/228 |
| 2002/0086504 A1 | 7/2002 | Park et al. | 438/580 |
| 2002/0197790 A1 | 12/2002 | Kizilyalli et al. | 438/240 |
| 2003/0032303 A1 | 2/2003 | Yu et al. | 438/770 |
| 2003/0045080 A1 | 3/2003 | Visokay et al. | 438/591 |
| 2005/0136580 A1 * | 6/2005 | Colombo et al. | 438/197 |
| 2006/0231892 A1 * | 10/2006 | Furukawa et al. | 257/347 |

FOREIGN PATENT DOCUMENTS

GB    2 358 737 A    4/2001

OTHER PUBLICATIONS

J.H. Haeni, et al., "Room-tempeture ferroelectricity in strained $SrTiO_3$", Nature Publishing Group, vol. 430, Aug. 12, 2004, pp. 758-762.

Mark L. Doczy et al., "A Method for Making a Semiconductor Device Having a High-K Gate Dielectric", U.S. Appl. No. 11/064,648, filed Dec. 1, 2004.

Matthew V. Metz, et al., "A Semiconductor Device with a High-K Gate Dielectric and a Metal Gate Electrode", U.S. Appl. No. Unknown, filed Jun. 13, 2005.

* cited by examiner

METAL GATE DEVICE WITH REDUCED OXIDATION OF A HIGH-K GATE DIELECTRIC

BACKGROUND OF THE INVENTION

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. When conventional processes are used to form such transistors, a silicon dioxide transition layer may form between the high-k dielectric and the substrate. The presence of that transition layer may unfavorably contribute to the overall electrical thickness of the gate dielectric stack.

DETAILED DESCRIPTION

In various embodiments, an apparatus and method relating to the formation of a substrate are described. In the following description, various embodiments will be described. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Figure 1:
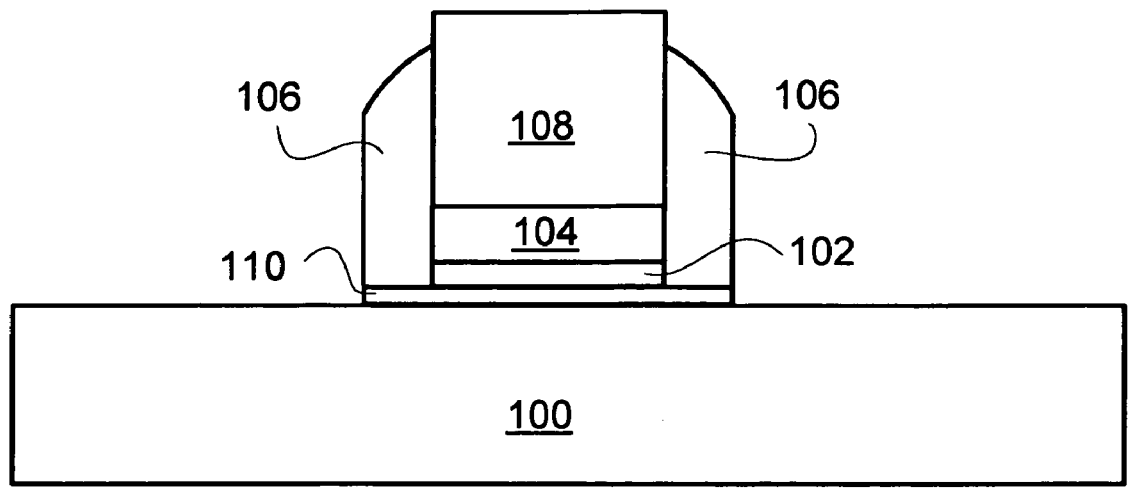
FIG. 1 is a cross sectional side view that illustrates the semiconductor device of one embodiment of the present invention.

FIG. 1 is a cross sectional side view that illustrates the semiconductor device of one embodiment of the present invention. In that semiconductor device, a high-k gate dielectric layer 102 may be formed on substrate 100, and a metal gate electrode 104 may be formed on the high-k gate dielectric layer 102. In the illustrated embodiment, there is a conductive gate layer 108, which may comprise doped polysilicon, on the metal gate electrode 104, although in other embodiments, the metal gate electrode 104 may extend higher and the device may lack a doped polysilicon or other conductive gate layer 108 on the metal gate electrode.

Substrate 100 may comprise any material that may serve as a foundation upon which a semiconductor device may be built. In this embodiment, substrate 100 is a silicon containing substrate. The substrate 100 may be a bulk substrate 100, such as a wafer of single crystal silicon, a silicon-on-insulator (SOI) substrate 100, such as a layer of silicon on a layer of insulating material on another layer of silicon, or another type of substrate 100. The device formed on the substrate 100 may be a transistor in some embodiments. The device may be a planar transistor on a bulk substrate 100, a planar transistor on an SOI substrate 100, a FIN-FET transistor on a bulk substrate 100, a FIN-FET transistor on an SOI substrate 100, a tri-gate transistor on a bulk substrate 100, a tri-gate transistor on an SOI substrate, or another type of transistor or other device.

The high-k gate dielectric layer 102 may comprise, for example, hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Although a few examples of materials that may be used to form the high-k gate dielectric layer 102 are described here, the high-k gate dielectric layer 102 may be made from other materials that serve to reduce gate leakage in other embodiments.

In one embodiment of the present invention, high-k gate dielectric layer 102 may be formed on the substrate 100 by an atomic layer chemical vapor deposition ("ALCVD") process. In an ALCVD process, a growth cycle may be repeated until a high-k gate dielectric layer 102 of a desired thickness is created. Such a growth cycle may comprise the following sequence in an embodiment. Steam is introduced into a CVD reactor for a selected pulse time, followed by a purging gas. A precursor (e.g., an organometallic compound, a metal chloride or other metal halide) is then pulsed into the reactor, followed by a second purge pulse. (A carrier gas that comprises nitrogen or another inert gas may be injected into the reactor at the same time.)

While operating the reactor at a selected pressure and maintaining the substrate at a selected temperature, steam, the purging gas, and the precursor are, in turn, fed at selected flow rates into the reactor. By repeating this growth cycle—steam, purging gas, precursor, and purging gas—multiple times, one may create a high-k gate dielectric layer 102 of a desired thickness on the substrate 100. The pressure at which the reactor is operated, the gases' flow rates, and the temperature at which the substrate is maintained may be varied depending upon the application and the precursor that is used. The CVD reactor may be operated long enough to form the high-k gate dielectric layer 102 with the desired thickness. In some embodiments, the high-k gate dielectric layer 102 may be less than about 40 angstroms thick. In other embodiments, the high-k gate dielectric layer 102 may be between about 5 angstroms and about 20 angstroms thick.

The high-k gate dielectric layer 102 may have a k-value higher than about 7.5 in some embodiments. In other embodiments, the high-k gate dielectric layer 102 may have a k-value higher than about 10. In other embodiments, the high-k gate dielectric layer 102 may comprise a material such as $Al_2O_3$ with a k-value of about 12, or may comprise a material with a higher k-value than that. In other embodiments, the high-k gate dielectric layer 102 may have a k-value between about 15 and about 25, e.g. $HfO_2$. In yet other embodiments, the high-k gate dielectric layer 102 may have a k-value even higher, such as 35, 80 or even higher.

After forming the high-k gate dielectric layer 102 on the substrate 100, the metal gate electrode 104 may be formed on the high-k gate dielectric layer 102. Metal gate electrode 104 may be formed using conventional metal deposition processes, e.g. CVD or PVD processes, by using ALCVD, or another suitable method, and may comprise any conductive material from which metal gate electrodes may be derived. Materials that may be used to form n-type metal gate electrodes include: hafnium, zirconium, titanium, tantalum, aluminum, their alloys (e.g., metal carbides that include these elements, i.e., hafnium carbide, zirconium carbide, titanium carbide, tantalum carbide, and aluminum carbide), and aluminides (e.g., an aluminide that comprises hafnium, zirconium, titanium, tantalum, or tungsten). Materials for forming p-type metal gate electrodes include: ruthenium, palladium, platinum, cobalt, nickel, and conductive metal oxides, e.g., ruthenium oxide. Alternatively, a mid-gap metal gate material, e.g. stoichiometric titanium nitride or tantalum nitride, may be used in some embodiments.

In some embodiments, metal NMOS gate electrodes may have a workfunction that is between about 3.9 eV and about 4.2 eV. In some embodiments, metal PMOS gate electrodes may have a workfunction that is between about 4.9 eV and about 5.2 eV. A metal gate electrode 104 that is formed on a high-k gate dielectric layer 102 may consist essentially of a homogeneous metal layer. Alternatively, relatively thin n-type or p-type metal layers (like those listed above) may generate the lower part of the metal gate electrode, with the remainder of the metal gate electrode comprising another metal or metals, e.g., a metal that may be easily polished like tungsten, aluminum, titanium, or titanium nitride. Although a few examples of materials for forming a metal gate electrode are identified here, such a component may be made from many other materials, as will be apparent to those skilled in the art.

Additionally, while device may be an NMOS or PMOS device, other types of devices may be made within the scope of the present invention as well. For example, a silicon on insulator (SOI) or other type of device may be made with mid-gap gate electrode materials, e.g. stoichiometric titanium nitride or tantalum nitride, among other materials, rather than NMOS or PMOS gate electrode materials. In some embodiments, the material of the mid-gap gate electrode 104 may have a workfunction between the workfunctions of NMOS and PMOS gate electrode materials There may be a set of first spacers 106 formed on either side of the gate electrode 104, high-k gate dielectric layer 102, and conductive gate layer 108. The spacers 106 may be formed of a material that is substantially free of oxygen in some embodiments. For example, in an embodiment the set of first spacers 106 may comprise a carbon doped nitride, with 8-12% carbon and silicon nitride. In other embodiments, the set of first spacers 106 may comprise other materials.

In an embodiment, the device may be a transistor. There may be a thin oxide layer 110 on the substrate 100 beneath the gate stack 102, 104, 108 and first set of spacers 106 in some embodiments. This thin oxide layer 110 may be as thin as a monolayer of oxide in some embodiments. The thin oxide layer 110 may provide a potential path for oxygen to travel from an outer edge of the first set of spacers 106 furthest from the gate stack 102, 104, 108 to a region beneath the gate stack 102, 104, 108. If oxygen reaches that region it may react with the substrate 100 to form an unwanted thicker oxide beneath the gate stack 102, 104, 108 and reduce the performance of the transistor.

Figure 2:
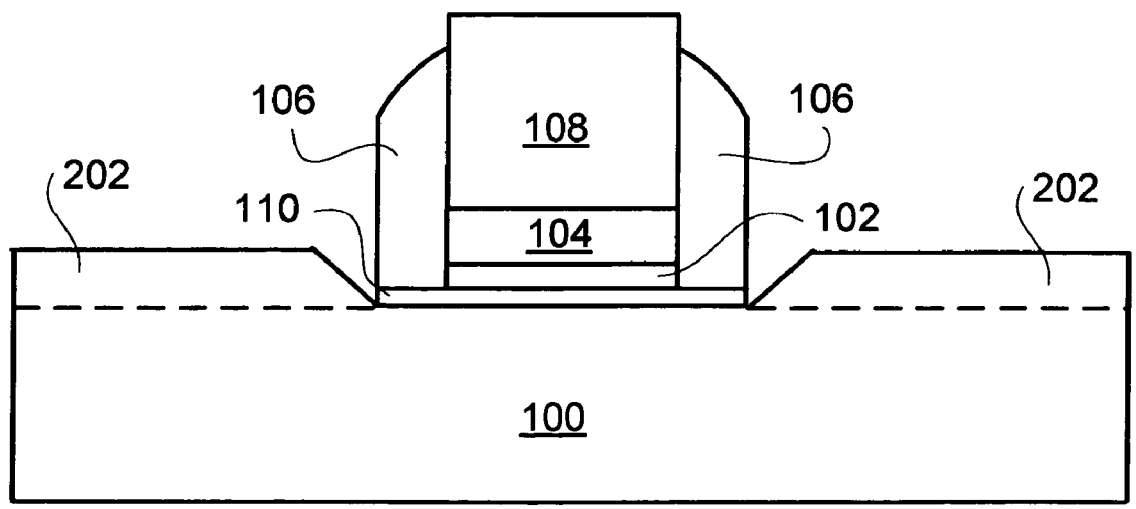
FIG. 2 is a cross sectional side view that illustrates additional regions added to the substrate in some embodiments.

FIG. 2 is a cross sectional side view that illustrates additional regions 202 added to the substrate 100 in some embodiments. The additional regions 202 may be added in some embodiments but omitted in other embodiments. For example, when the device is a Fin-FET transistor or tri-gate transistor, there may be only a small amount of substrate on either side of the gate stack 102, 104, 108. In such an embodiment, it may be beneficial to add material to the substrate 100 by forming the additional regions 202. In some embodiments, the additional regions 202 may be added by epitaxy. In an embodiment, the additional regions 202 may comprise the same material as the original substrate 100. The additional regions 202 may be considered portions of the substrate 100 after formation of the additional regions 202. As shown in FIG. 2, the additional regions 202 may have a height above the original substrate 100 a distance away from the first set of spacers 106, but the thickness of the additional regions 202 may decrease closer to the first set of spacers 106. In some embodiments, such as when the device is a planar transistor, the additional regions 202 may be omitted.

Figure 3:
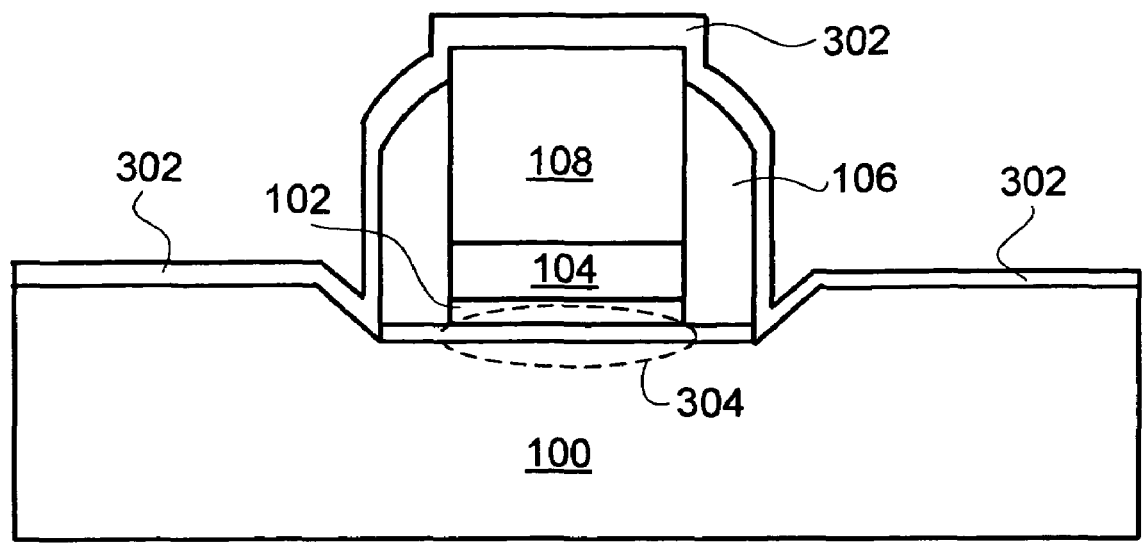
FIG. 3 is a cross sectional side view that illustrates the capping layer deposited on the top surface of the gate stack, the first set of spacers and the substrate.

FIG. 3 is a cross sectional side view that illustrates capping layer 302 deposited on the top surface of the gate stack 102, 104, 108, the first set of spacers 106 and the substrate, according to one embodiment of the present invention. In an embodiment, the capping layer 302 may be an oxygen barrier layer 302 that at least partially, if not completely, prevents oxygen from reaching a region 304 beneath the gate stack 102, 104, 108. The capping layer 302 may seal the thin oxide layer 110 from oxygen-containing structures and/or ambient oxygen in further process steps, so may prevent the transport of oxygen by the thin oxide layer 110 into the region 304 beneath the gate stack 102, 104, 108. This prevention of oxygen transport beneath the gate stack 102, 104, 108 may at least partially prevent oxidation of the substrate 100, which could result in the formation of undesired oxide, such as silicon oxide, beneath the gate stack 102, 104, 108. Such an undesired oxide could be of a thickness enough to degrade the performance of the device if its formation is not prevented. In an embodiment, the capping layer 302 may be less than about 75 angstroms thick. In another embodiment, the capping layer 302 may be about 50 angstroms thick or less. In an embodiment, the capping or oxygen barrier layer 302 may comprise a nitride material, such as a carbon doped nitride, a stoichiometric silicon nitride deposited in a low $O_2$-push fashion or a silicon carbide, although other materials may be used in other embodiments. The capping layer 302 may be substantially free from oxygen, so as not to serve as a source of oxygen that could be transported by the thin oxide layer to the region 304 beneath the gate stack 102, 104, 108. In an embodiment, the capping layer 302 may be a conformal layer that covers the exposed surfaces of the device. In an embodiment, the capping or oxygen barrier layer 302 may be deposited by chemical or physical vapor deposition, although atomic layer deposition or other methods may be used as appropriate. The formation of the capping layer 302 may be performed in an ambient atmosphere with little or no oxygen.

Figure 4:
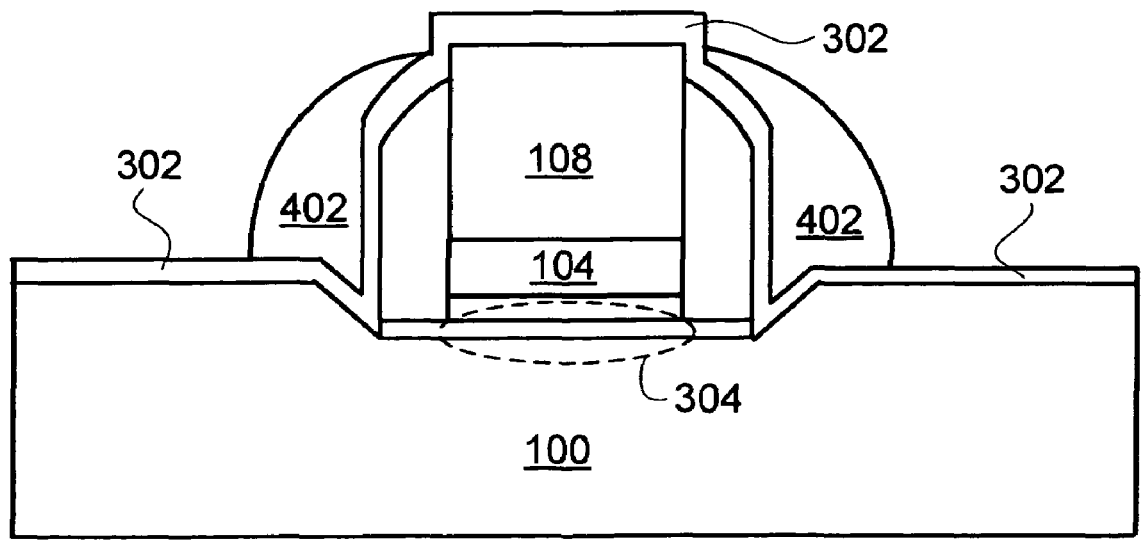
FIG. 4 is a cross sectional side view that illustrates a second set of spacers formed on either side of the gate electrode.

FIG. 4 is a cross sectional side view that illustrates a second set of spacers 402 formed on either side of the gate electrode 104, according to one embodiment. In an embodiment, the second set of spacers 402 may be formed by depositing a thick layer of material over the device, then etching portions of the layer away to form the second set of spacers 402. In an embodiment, the second set of spacers 402 may comprise an oxygen-containing material such as a Bis(tert-butylamino) silane-based silicon oxide, a silicon oxynitride, or another material, depending on the need to subsequently recess said second spacers following the self-aligned source/drain implant described below. As the capping layer 302 may seal the thin layer of oxide 110 away from the layer of material used to make the second set of spacers 402, the material used to make the second set of spacers 402 may contain oxygen; the capping layer 302 may prevent transport of oxygen from the material of the second set of spacers 402 to the region 304 beneath the gate stack 102, 104, 108, and therefore prevent formation of a thicker oxide layer 110.

Figure 5A:
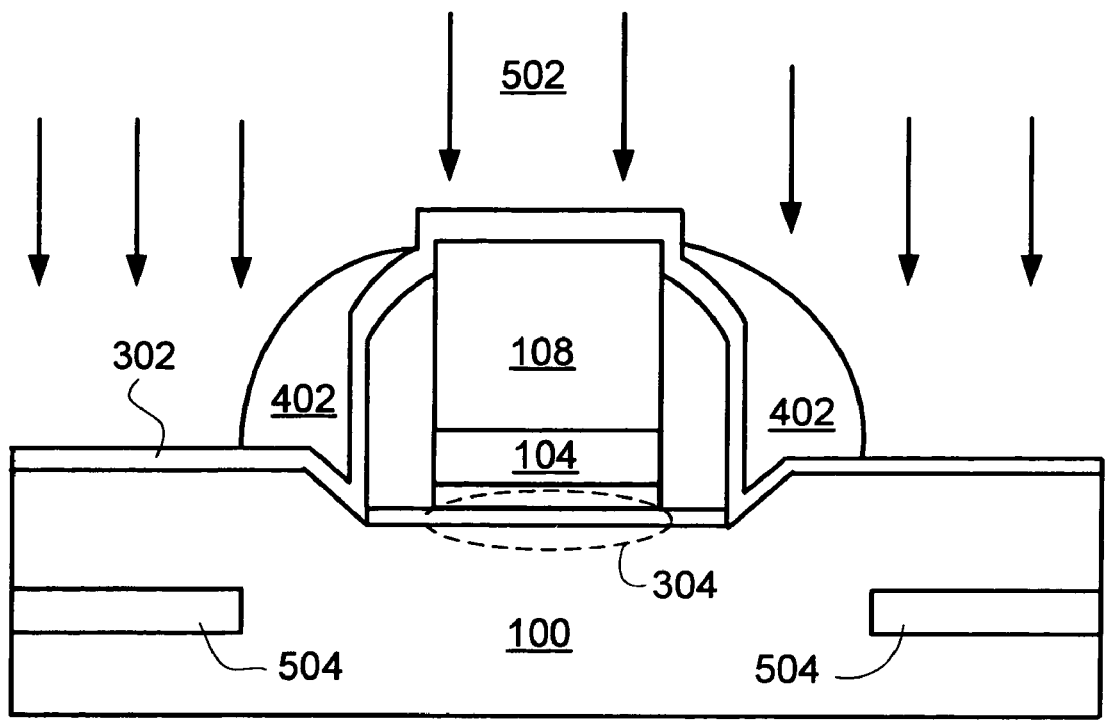
FIGS. 5a and 5b are cross sectional side views that illustrate the formation of source/drain implant regions.

FIG. 5a is a cross sectional side view that illustrates the formation of source/drain implant regions 504 by implantation of ions 502, as is known in the art. In the illustrated embodiment, the ions 502 are implanted into the substrate 100 to form the source/drain implanted regions 504 through the capping layer 302 on the substrate 100.

Figure 5B:
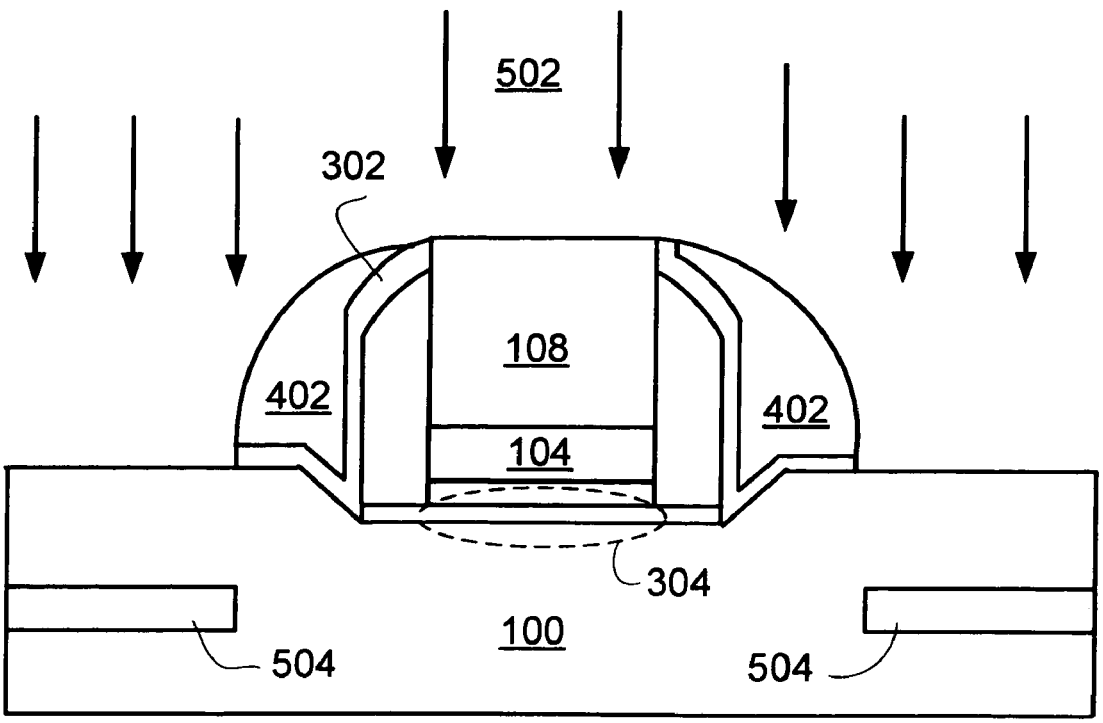

FIG. 5b is a cross sectional side view that illustrates another embodiment of the formation of source/drain implant regions 504 by implantation of ions 502, as is known in the art. In the illustrated embodiment, portions of the capping layer 302 beyond the second set of spacers 402 have been removed prior to ion implantation. The ions 502 are implanted into the substrate 100 to form the source/drain implanted regions 504 without being implanted through the capping layer 302 on the substrate 100. The remaining portions of the capping layer 302 may be sufficient to seal the thin oxide layer 110 from oxygen present in structures of the device and present in the ambient atmosphere during further processing. Thus, as shown in FIGS. 5a and 5b, portions of the capping layer 302 that do not function to seal the thin oxide layer from sources of oxygen may be removed at various times during formation of the device in various embodiments.

Figure 6:
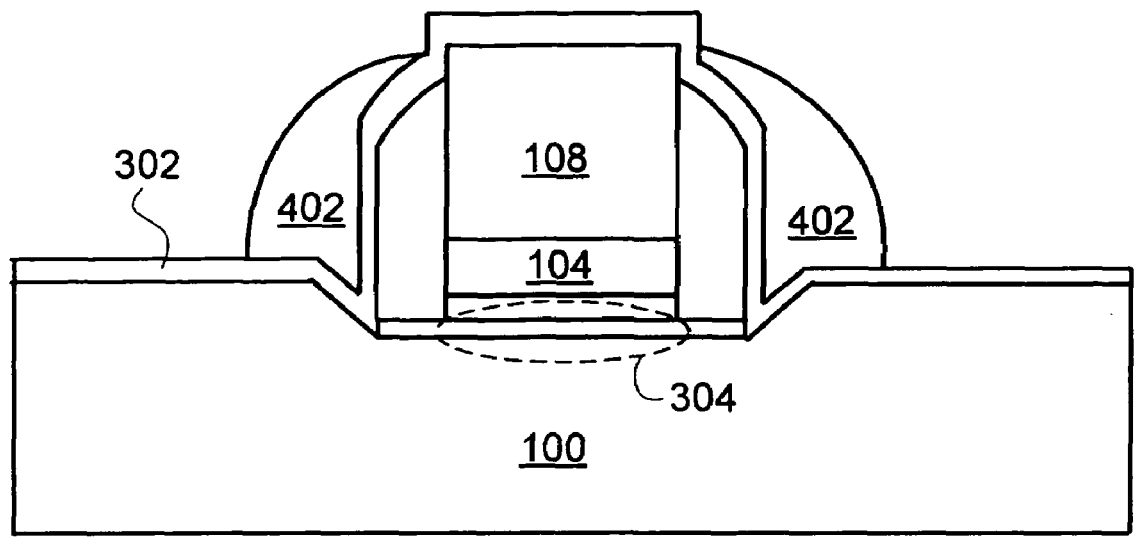
FIG. 6 is a cross sectional side view that illustrates the device of FIG. 5a after annealing of the source/drain implanted regions.

FIG. 6 is a cross sectional side view that illustrates the device of FIG. 5a after annealing of the source/drain implanted regions 504 have been performed to form source and drain regions in the substrate 100, as is known in the art. The annealing process may be a high temperature annealing process. During the annealing process, the capping layer 302 may help prevent formation of an oxide under the gate electrode 104. Absent the capping layer 302, the high temperature of the annealing process may cause rapid formation of a thick layer of oxide beneath the gate stack 102, 104, 108, reducing the performance of the device.

Figure 7:
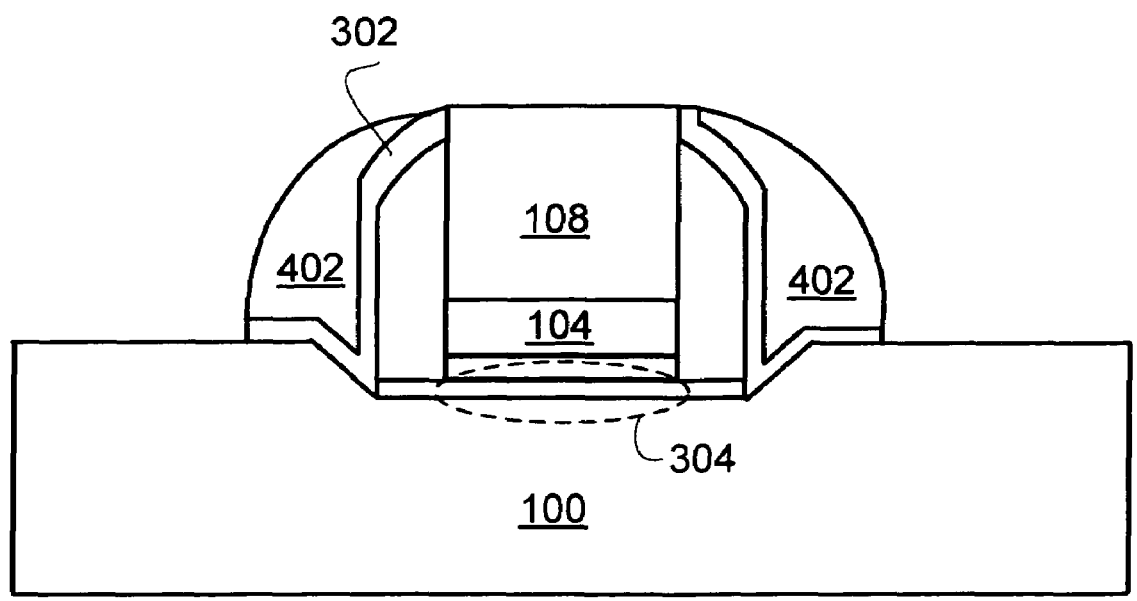
FIG. 7 is a cross sectional side view that illustrates the device after removal of portions of the capping layer.

FIG. 7 is a cross sectional side view that illustrates the device after removal of portions of the capping layer 302 that are exposed and not covered by the second set of spacers 402. The removal may be done by a wet etching process in one embodiment, although any suitable process may be used to remove the exposed portions of the capping layer 302. As stated above, this removal of portions of the capping layer 302 may be done at other times during processing of the device rather than following anneal. Following anneal and removal of portions of the capping layer 302, additional steps such as silicidation may be performed to finish fabricating the device.

Figure 8:
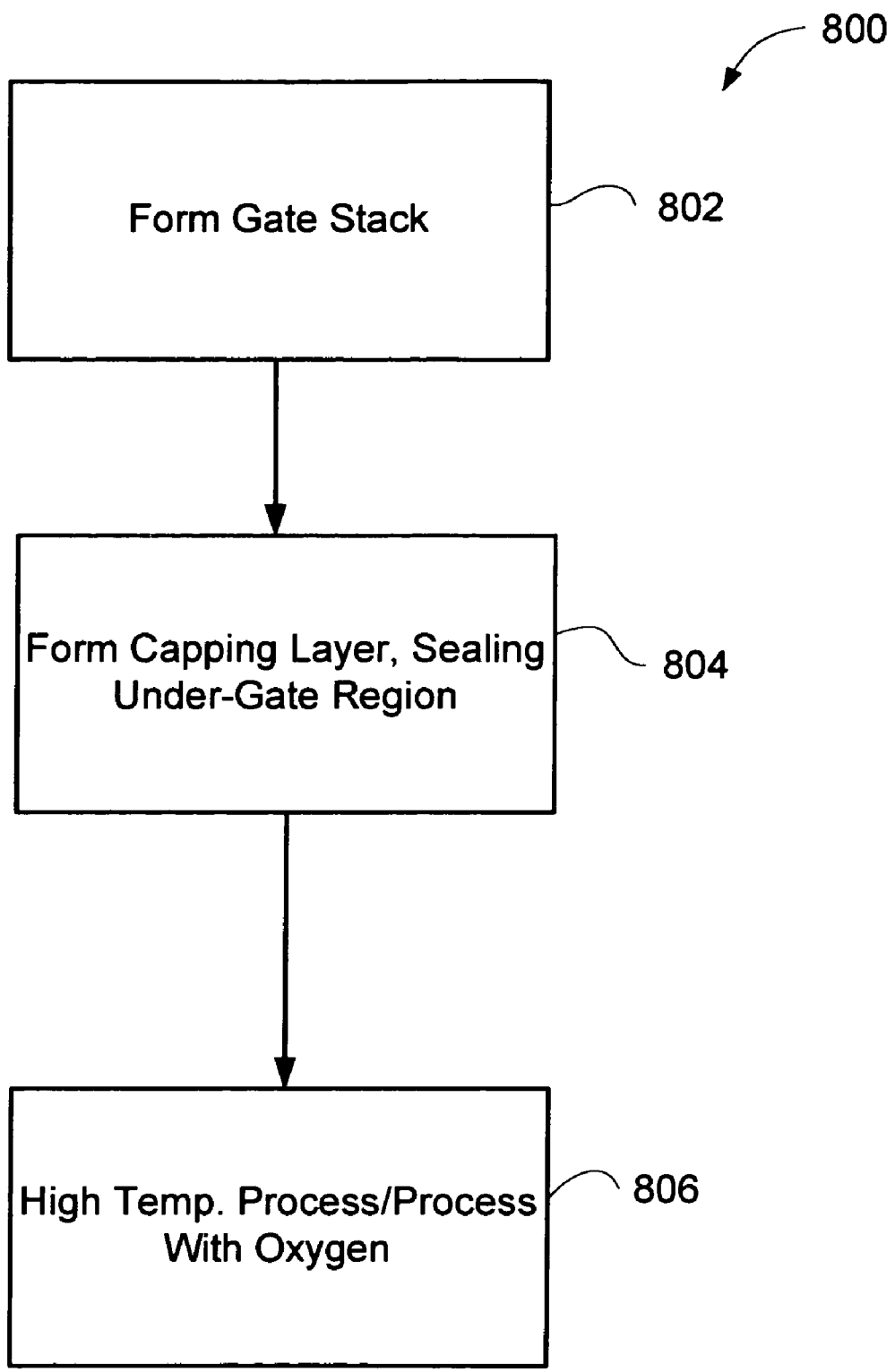
FIG. 8 is a flow chart that summarizes a method according to an embodiment of the present invention.

FIG. 8 is a flow chart 800 that summarizes a method according to an embodiment of the present invention. A gate stack of a device, such as gate stack 102, 104, 108 shown in FIG. 1, may be formed 802. A capping layer, such as capping layer 302 of FIG. 3, may be formed 804, sealing a region under the gate stack from oxygen. For example, region 304 of FIG. 3 is sealed by capping layer 302 to prevent oxygen from being transported by the thin oxide layer 110 under the gate stack 102, 104, 108 and forming a thick oxide layer that would degrade device performance. Processes at high temperature or processes that involve oxygen (as part of an ambient atmosphere or part of the material of a structure) may then be performed 806. Since the under gate region is sealed by the capping layer 302, oxygen may be mostly or entirely prevented from being transported to the under gate region during these processes. Thus, reaction of oxygen with the substrate beneath the gate and formation of a thick oxide layer beneath the gate may be avoided, which may prevent degradation of the performance of the device.

Figure 9:
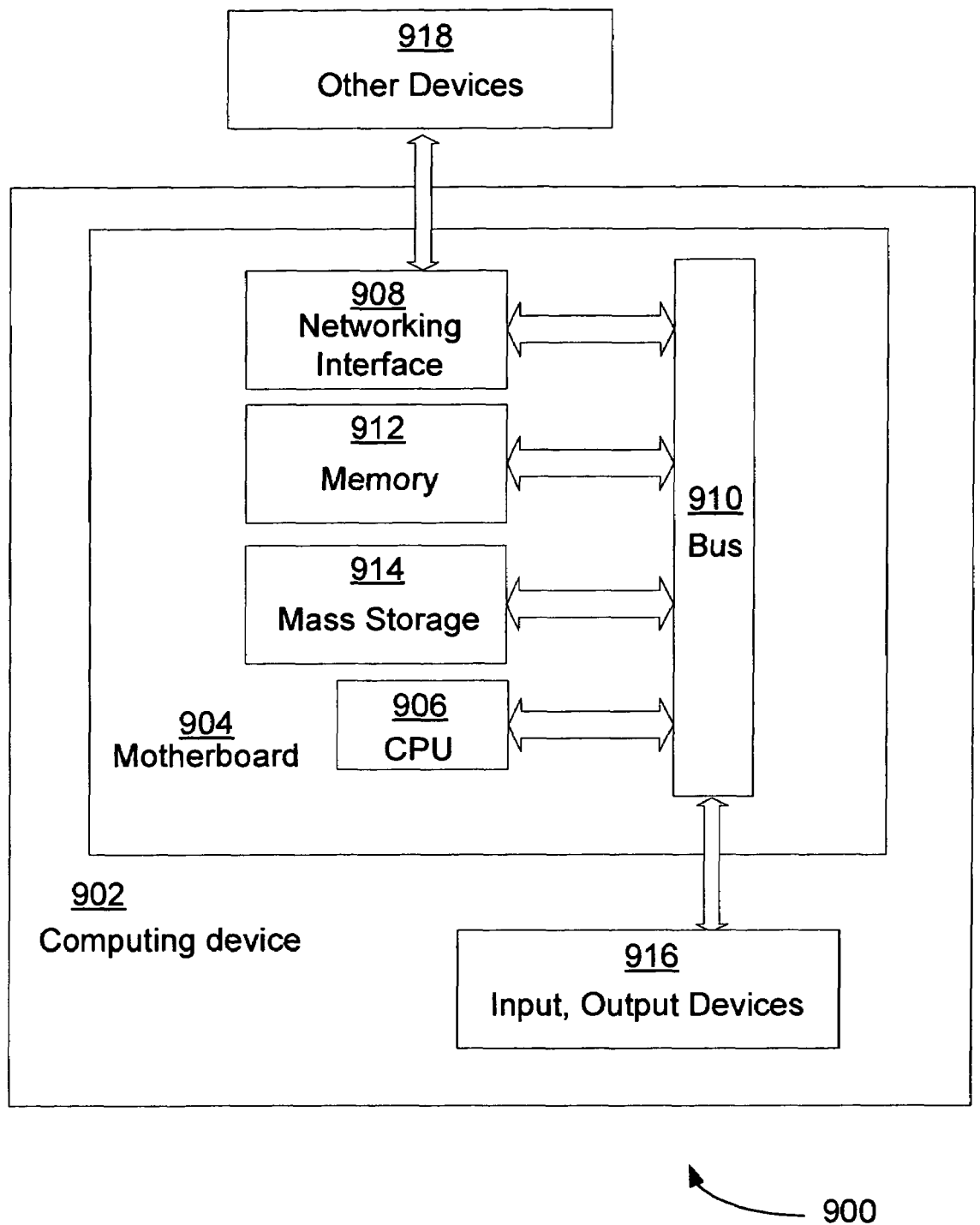
FIG. 9 illustrates a system in accordance with one embodiment of the present invention.

FIG. 9 illustrates a system 900 in accordance with one embodiment of the present invention. One or more devices formed with the capping layer 302 as described above may be included in the system 900 of FIG. 9. As illustrated, for the embodiment, system 900 includes a computing device 902 for processing data. Computing device 902 may include a motherboard 904. Coupled to or part of the motherboard 904 may be in particular a processor 906, and a networking interface 908 coupled to a bus 910. A chipset may form part or all of the bus 910. The processor 906, chipset, and/or other parts of the system 900 may include one or more devices with the capping layer 302.

Depending on the applications, system 900 may include other components, including but are not limited to volatile and non-volatile memory 912, a graphics processor (integrated with the motherboard 904 or connected to the motherboard as a separate removable component such as an AGP or PCI-E graphics processor), a digital signal processor, a crypto processor, mass storage 914 (such as hard disk, compact disk (CD), digital versatile disk (DVD) and so forth), input and/or output devices 916, and so forth.

In various embodiments, system 900 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Any of one or more of the components 906, 914, etc. in FIG. 9 may include one or more devices with the capping layer 302 as described herein. For example, a transistor formed with the capping layer 302 may be part of the CPU 906, motherboard 904, graphics processor, digital signal processor, or other devices.

In an embodiment, the device may be a semiconductor device including a substrate, a thin oxide layer on the substrate, a high-k gate dielectric layer on the thin oxide layer, a metal gate electrode on the high-k gate dielectric layer, and a capping layer that is substantially free of oxygen and substantially seals the thin oxide layer from structures that comprise oxygen. The device may also have a first set of spacers on either side of the metal gate electrode and a second set of spacers on either side of the first set of spacers, wherein the capping layer is between the first set of spacers and the second set of spacers. The second set of spacers may have a bottom surface and the capping layer may extend beneath the bottom surface of the second set of spacers. The first set of spacers may have a bottom surface and the thin oxide layer may extend beneath the bottom surface of the first set of spacers. The capping layer may be on the sides of the first set of spacers and may be on the substrate extending away from the sides of the first set of spacers for a distance.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A method for making a semiconductor device, comprising:
   forming a high-k gate dielectric layer on a semiconductor substrate;
   forming a metal gate electrode on the high-k gate dielectric layer, the metal gate electrode having a first side and a second side;
   forming a first set of spacers on the first and second sides of the metal gate electrode, wherein the first set of spacers is substantially free of oxygen; and
   forming a capping layer that is substantially free of oxygen on a top surface of the substrate layer, sides of the first set of spacers, and a top surface of the metal gate electrode.

2. The method of claim 1, further comprising:
   forming a second set of spacers on the capping layer on the first and second sides of the metal gate electrode; and
   removing portions of the capping layer on the top surface of the substrate that extend beyond sides of the second set of spacers.

3. The method of claim 1, further comprising implanting ions into the substrate.

4. The method of claim 3, wherein the capping layer substantially prevents formation of oxide under the high-k gate dielectric layer during the implantation of ions.

5. The method of claim 3, wherein the ions are implanted into the substrate through the capping layer.

6. The method of claim 1, further comprising annealing the substrate after implantation to form source and drain regions.

7. The method of claim 6, further comprising removing portions of the capping layer, wherein the annealing occurs before removing portions of the capping layer.

8. The method of claim 6, wherein the capping layer substantially prevents formation of oxide under the high-k gate dielectric layer during the annealing.

9. The method of claim 1, wherein the capping layer comprises nitride.

10. The method of claim 1, wherein the capping layer comprises a material selected from the group consisting of 8-12% carbon-doped silicon nitride, stoichiometric silicon nitride and silicon carbide.

11. The method of claim 1, wherein the capping layer has a thickness below about 75 angstroms.

12. The method of claim 1, wherein the first set of spacers comprises 8-12% carbon-doped silicon nitride.

13. The method of claim 1, farther comprising:
   prior to forming the capping layer, forming a thin oxide layer between the high-k gate dielectric layer and the semiconductor substrate, wherein the capping layer prevents the thin oxide layer from contacting an oxygen source.

* * * * *